United States Patent [19]

Young et al.

[11] Patent Number: 5,446,867
[45] Date of Patent: Aug. 29, 1995

[54] MICROPROCESSOR PLL CLOCK CIRCUIT WITH SELECTABLE DELAYED FEEDBACK

[75] Inventors: Ian Young; Keng L. Wong; Jeffrey Smith, all of Portland, Oreg.

[73] Assignee: Intel Corporation, Santa Clara, Calif.

[21] Appl. No.: 890,937

[22] Filed: May 29, 1992

[51] Int. Cl.$^6$ ............................ G06F 1/00; G06F 1/04; G06F 1/06; G06F 1/10
[52] U.S. Cl. ..................................... 395/550; 331/17; 364/DIG. 1; 364/270; 364/270.3
[58] Field of Search ..................... 395/550; 331/17, 25, 331/1 A; 371/1

[56] References Cited

U.S. PATENT DOCUMENTS

| | | | |
|---|---|---|---|
| 4,771,250 | 9/1988 | Statman et al. | 331/17 |
| 5,008,636 | 4/1991 | Markinson et al. | 331/2 |
| 5,017,889 | 5/1991 | Verbeek | 331/1 A |
| 5,079,519 | 1/1992 | Ashbly et al. | 331/1 A |
| 5,218,314 | 6/1993 | Efendovich et al. | 328/155 |
| 5,307,381 | 4/1994 | Ahuja | 375/107 |

OTHER PUBLICATIONS

A CMOS 100 MHz Microprocessor TA 5.1, Portland Technology Development, Intel Corporation, Joe Schutz.
Test Your Charge–Pump Phase Detectors, Electronic Design 12, Dr. William Egan, Jun. 7, 1978, pp. 134–137.
A 30–MHz Hybrid Analog/Digital Clock Recovery Circuit In 2-μM CMOS, IEEE Journal of Solid-State Circuits, vol. 25, No. 6, Dec. 1990, pp. 1385–1394.

*Primary Examiner*—Thomas C. Lee
*Assistant Examiner*—D. Dinh
*Attorney, Agent, or Firm*—Blakely, Sokoloff, Taylor & Zafman

[57] ABSTRACT

A circuit for use in high performance microprocessor systems which eliminates skew between a clock signal internal to the microprocessor core and inputs generated by a clock signal external to the microprocessor core. The circuit includes a phase locked loop (PLL), a delay line and a clock driver. The PLL locks and de-skews the external clock edge to that of the internal clock to thereby provide an overall reduction of the setup and hold time window to satisfy the tight I/O timings required by high performance microprocessor systems. By incorporating the same PLL in all the closely coupled components of the microprocessor core, similar temperature and power supply tracking of such components is achieved. The PLL is a charge-pump based circuit of the type known in the art incorporating a phase detector, charge pump, loop filter and voltage controlled oscillator (VCO). However, the inclusion of the delay line in the feedback path of the PLL provides advantages not available from PLLs without such a delay line. A programmable tap is provided in the delay line which allows the I/O circuitry of the microprocessor to work with either CMOS or TTL input specifications. Specifically, compensation is provided for the differences in propagation delay between CMOS and TTL input buffers.

9 Claims, 5 Drawing Sheets

MICROPROCESSOR PLL CLOCK CIRCUIT WITH SELECTABLE DELAYED FEEDBACK

SUMMARY OF THE INVENTION

The present invention is a circuit for use in high performance microprocessor systems. The circuit eliminates skew between a clock signal internal to the microprocessor core and inputs generated by a clock signal external to the microprocessor core. The circuit includes a phase locked loop (PLL), a delay line and a clock driver. The PLL locks and deskews the external clock edge to that of the internal clock to thereby provide an overall reduction of the setup and hold time window to satisfy the tight I/O timings required by high performance microprocessor systems. By incorporating the same PLL in all the closely coupled components of the microprocessor system, i.e., CPU, cache memory and controller for the cache memory, similar temperature and power supply tracking of the I/O timings of such components is achieved.

The PLL is a feedback control system which strives to maintain a constant phase difference between two input signals XCLK and CLKIN as shown in FIG. 1. If the gain of the loop is high enough, then during steady state operation, a very small phase error is found between XCLK and CLKIN. In this case, the two signals are said to be "deskewed".

The PLL is a charge-pump based circuit of the type known in the art incorporating a phase detector, charge pump, loop filter and voltage controlled oscillator (VCO). However, the inclusion of the delay line in the feedback path of the PLL provides advantages not available from PLLs without such a delay line. Specifically, points are tapped off the delay line to generate four internal clock signals: one (CLKIN) for external input latching, one (CLKOUT) for valid external output clocking, and two (PH1 and PH2) for clocking of the internal core of the microprocessor. One of these clocks, the external input clock or CLKIN, is fed back to the input of the phase detector, and is thus deskewed with respect to the external clock (XCLK). In the preferred embodiment, PH2's falling edge is timed off a specific amount of delay after CLKIN's falling edge. PH1's and CLKOUT's rising edges are also timed off a specific amount of delay after CLKIN's falling edge (which is locked to XCLK's rising edge).

The locking of CLKIN to XCLK provides two advantages. Firstly, a very small hold time (less than 1ns) is obtained independent of process, temperature and power supply variations for input signals to the microprocessor. Secondly, a stable reference time is made available from which the other three clocks (CLKOUT, PH1 and PH2) can be positioned via the delay line taps. With CLKIN locked to provide a small hold time, and by fine tuning the positioning of the other three clocks to provide optimum I/O to core and core to I/O timings, it is possible to provide maximum high speed I/O performance for the microprocessor. This arrangement has a further attraction in that it is frequency scalable. This is so because under fast process, temperature and power supply conditions, the delay line speeds up, bringing the falling edge of PH2 and the rising edges of PH1 and CLKOUT closer to the reference (falling) edge of CLKIN. The crowding of these signals closer to the external clock means the microprocessor can be clocked at a higher frequency.

The invented circuit also incorporates a programmable tap in the delay line for CLKIN. Specifically, if the I/O circuitry of the microprocessor is designed to work with either CMOS or TTL input specifications, a control signal, CMOS/TTL from a pad input, may be used to switch the position of CLKIN with respect to the other three internal clocks. However, since CLKIN is always locked to the external clock, to the world external to the microprocessor, changing the CMOS/TTL control signal effectively shifts the other three internal clocks. In this manner, compensation is provided for the differences in propagation delay between CMOS and TTL input buffers. This ability to switch modes allows a CMOS microprocessor to be compatible with a predecessor microprocessor using a TTL interface, while at the same time providing a high performance CMOS mode which has superior I/O timing. This aspect of the invention is implemented by providing a control signal which enables one of two different delay paths depending on whether the propagation delay is to accommodate a TTL input buffer or a CMOS input buffer.

An input buffer is in the critical path for each of the external signals which must propagate into the microprocessor core logic. Increased delay in this path can reduce the maximum operating clock frequency for the microprocessor. The critical timing path is from the rising edge of CLKIN to the rising/falling edges of PH1/PH2. To minimize this limitation when operating at maximum frequency, the timings of PH1/PH2 which control the microprocessor core are adjusted when the circuit changes from CMOS to TTL input buffers. Since the output I/O control clock CLKOUT has a critical timing from PH1/PH2 to the rising edge of CLKOUT, CLKOUT must also be adjusted.

DETAILED DESCRIPTION OF THE INVENTION

Figure 1:
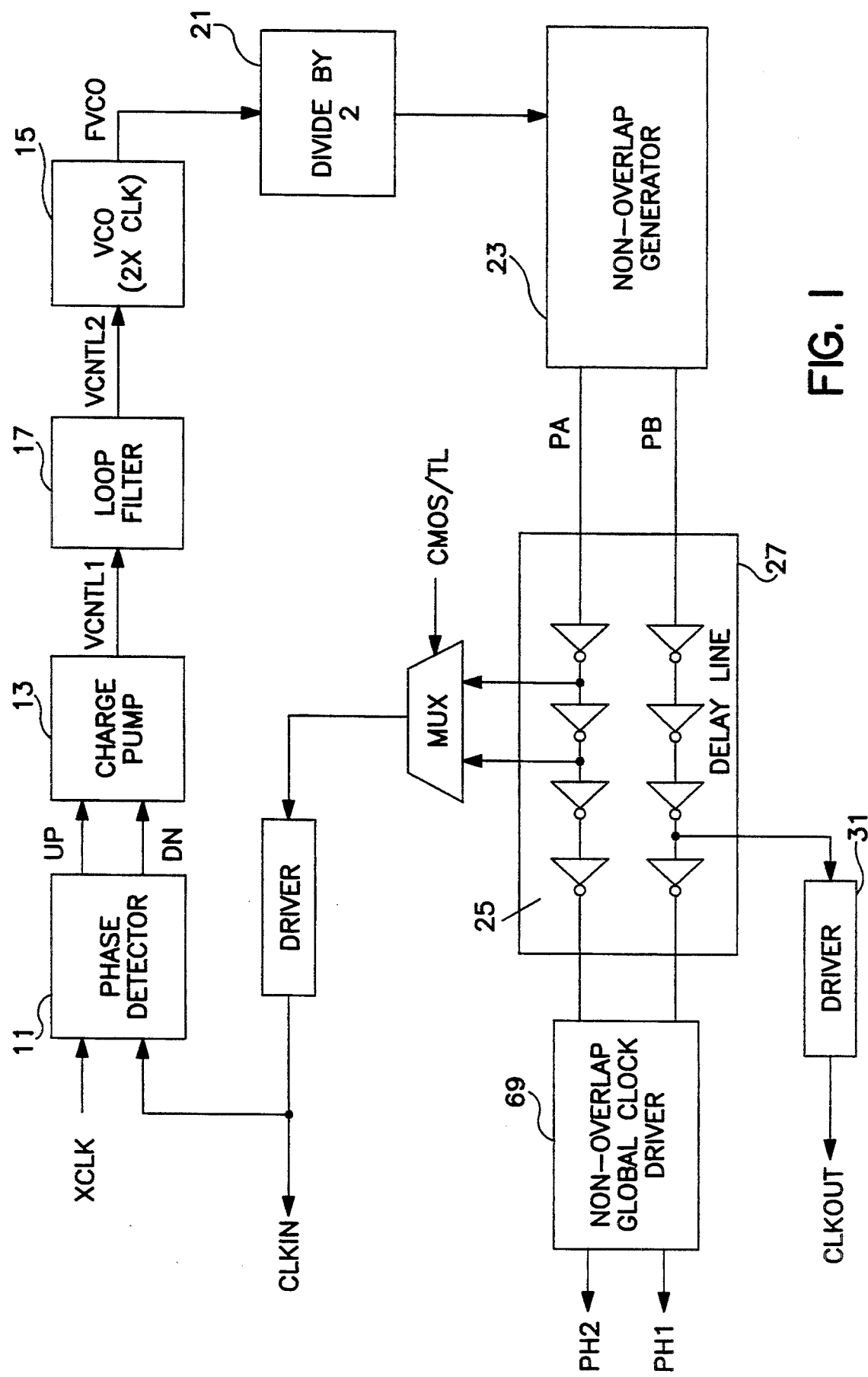
FIG. 1 is a block diagram of a circuit for providing selective clock modes for a microprocessor according to the present invention.

FIG. 1 is an overview block diagram of the invented system. Phase detector 11, charge pump 13, loop filter 17, and VCO 15 are standard components of the phase locked loop. A suitable phase detector, charge pump, loop filter and VCO which may be used to form the invented system are described in copending application Ser. No. 861,288 filed Mar. 31, 1992. The phase detector 11, on detection of a finite phase error at its inputs, directs the charge pump 13 to pump the control voltage higher or lower, depending on the direction of phase error. More particularly, if XCLK leads CLKIN, then activate UP. If CLKIN leads XCLK, then activate DN. If XCLK and CLKIN are locked, then neither UP nor DN is activated. Two RS flip-flops which form part of phase detector 11 record the low-to-high transition of their respective inputs, thus enabling the phase detector to recognize a pending high-to-low transition at each input independently. The input that goes low first will cause its corresponding output to go low; the subsequent high-to-low transition of the other input resets the output high, and also resets the flip-flops, which are then ready for the next high-going transition. A NAND reset gate in phase detector 11 plays a central role in determining whether to have overlap of UP and DN. To ensure no phase jitter from closed loop operation, the current switches in the charge pump must always be on. Thus, even at zero phase error, UP and DN should both be on for an equal but small amount of time. At non-zero phase error, one pulse would be longer than the other. The amount of overlap is directly determined by the strength of the NAND pulldown.

Charge pump 13 converts the digital states of the phase detector 11 to an analog voltage VCNTL1 suitable for controlling VCO 15. A passive low pass filter 17 is provided to ensure stable loop operation and low jitter. The filtered control voltage VCNTL2 affects the speed of oscillation of the VCO in the direction that reduces the original phase error. In a well designed stable loop, the corrections done in the loop result in very small phase error between the two inputs of the phase detector. This makes the PLL an excellent candidate to deskew two unrelated signals, as is the application here.

Figure 2:
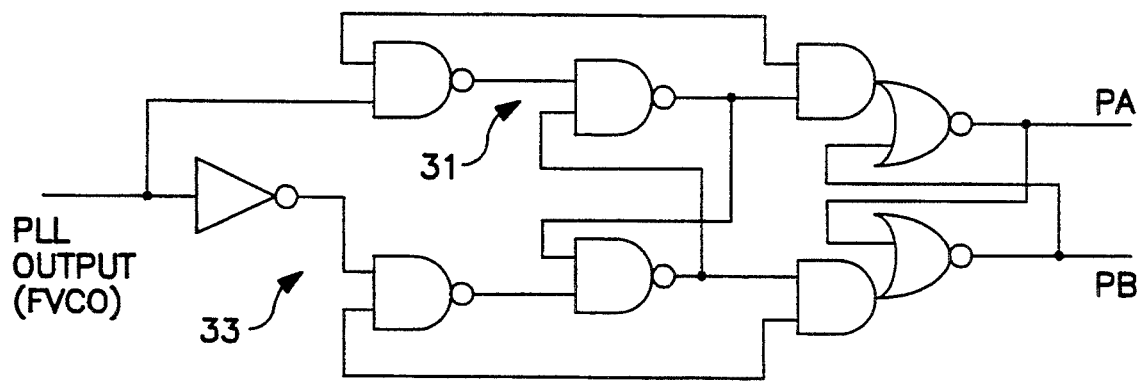
FIG. 2 is a circuit diagram of divide-by-two 21 and non-overlap generator 23.

The divide-by-two circuit 21 serves to output a 50% duty cycle waveform. The output signals, PA and PB, of the first non-overlap generator 23 are non-overlapping, i.e. PA goes high only after PB has gone low, and vice versa. The non-overlap time between PA and PB is tuned to be less than 1ns. In the preferred embodiment, the divide-by-two and the non-overlap generator circuits are actually implemented as one logic gate circuit, as shown in FIG. 2.

The divide-by-two circuit 21 is implemented as a master-slave flip-flop with complementary outputs. The master stage 31 is clocked and toggled by the PLL output clock's falling edge. The slave stage 33 is clocked and toggled by the rising edge of the PLL output clock's rising edge. In this manner, a signal having a 50% duty cycle is created. For duty cycles other than 50%, appropriate changes to circuit 21 should be apparent to persons skilled in the field of the invention. The complementary outputs PA and PB of the divider are arranged to affect each other in a cross-coupled manner, thus providing a feedback mechanism which only enables the pulling up of one signal after its complementary counterpart has gone low.

Figure 3:
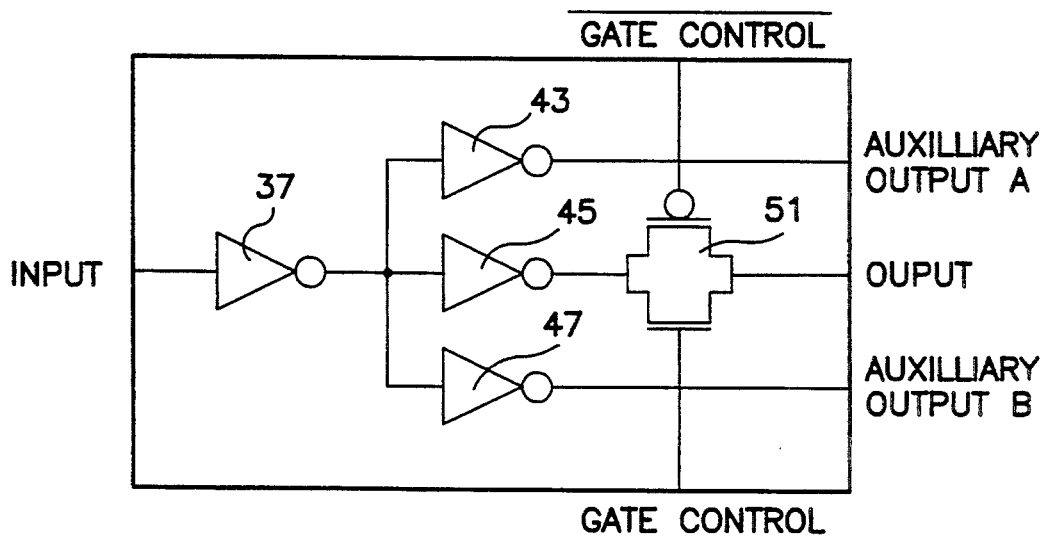
FIG. 3 is a circuit diagram of a single delay element of delay line 27.

The complementary non-overlapping signals PA and PB are then delayed in the delay line 27. The delay line comprises a set of identical delay elements and support logic circuitry. FIG. 3 shows the detail of one delay element. The design is optimized for ease of connection between the delay elements and also between supporting circuitry and the delay elements. The first inverter 37 in each element drives three other inverters 43, 45 and 47. The second inverter 45 drives a transmission gate 51 before the output goes to the input of the next element in the series. The two outside inverters 43 and 47 drive auxiliary outputs. In a complete delay line, these auxiliary outputs form convenient points representing different delay taps in the line. The transmission gate 51 in the delay element becomes a convenient element for selecting one output out of multiple delay paths. The signals Gate Control and $\overline{\text{Gate Control}}$ represent the CMOS mode or TTL mode select control signals and are generated by a CMOS/TTL decision logic circuit. This logic circuit may be utilized at the time a die containing the microprocessor is bonded to a package containing the pinouts for the integrated circuit. In this manner, the integrated circuits can be completely manufactured upto the packaging stage such that when a customer order comes in, the manufacturing can be completed with the selection of CMOS or TTL delay as requested by the customer taking place during the packaging stage. Alternatively, pinouts can be provided for the Gate Control signals and the selection of CMOS or TTL delay being made dynamically after the package containing the integrated circuit is placed onto a circuit board.

The delay element is also designed to closely track the circuit delays in the rest of the microprocessor. This is done by mixing two circuit elements in the delay element: inverting amplifying gates with typical fanout and passive transmission gates 51 made up of N- and P-type MOSFETs in parallel. This tracking is essential for the concept of frequency scaling, wherein the delay line does not constrain the rest of the microprocessor under varying fabrication or operating conditions, but instead, tracks these conditions and allows the microprocessor to run faster or slower as dictated by these conditions without losing functionality.

Figure 4:
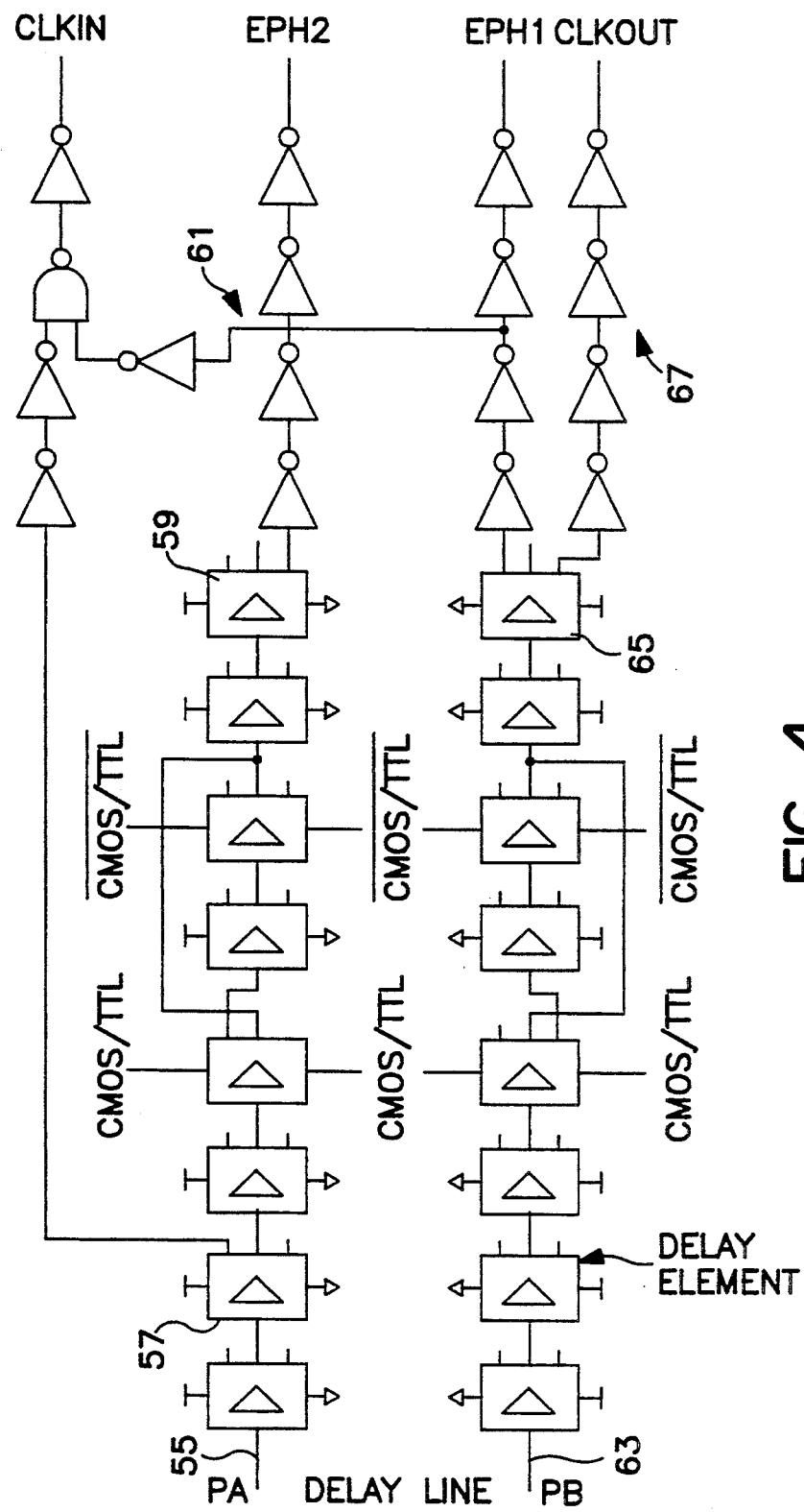
FIG. 4 is a circuit diagram of delay line 27.

A detailed explanation of the delay line operation is as follows. As shown in FIG. 4, there are actually two delay lines, one for PA and one for PB. PA enters the first delay line 55 and taps are taken off the second 57 and last delay 59 elements, buffered by four inversions 61, and then driven out as CLKIN and EPH2 respectively. Similarly, PB enters the second delay line 63. This time, both taps are taken off the last stage 65, buffered four times 67, and then driven out as CLKOUT and EPH1. EPH1 and EPH2 are early versions of PH1 and PH2 respectively. They form inputs to the non-overlap global clock driver 69, which further buffers EPH1 and EPH2 and drives out the global core clocks PH1 and PH2. EPH1 is also used to time the rising edge of CLKIN. This is in order for no overlap to exist between PH1 and CLKIN, a feature essential for proper functioning of the interface between the core and the I/O section of the microprocessor.

Figure 5:
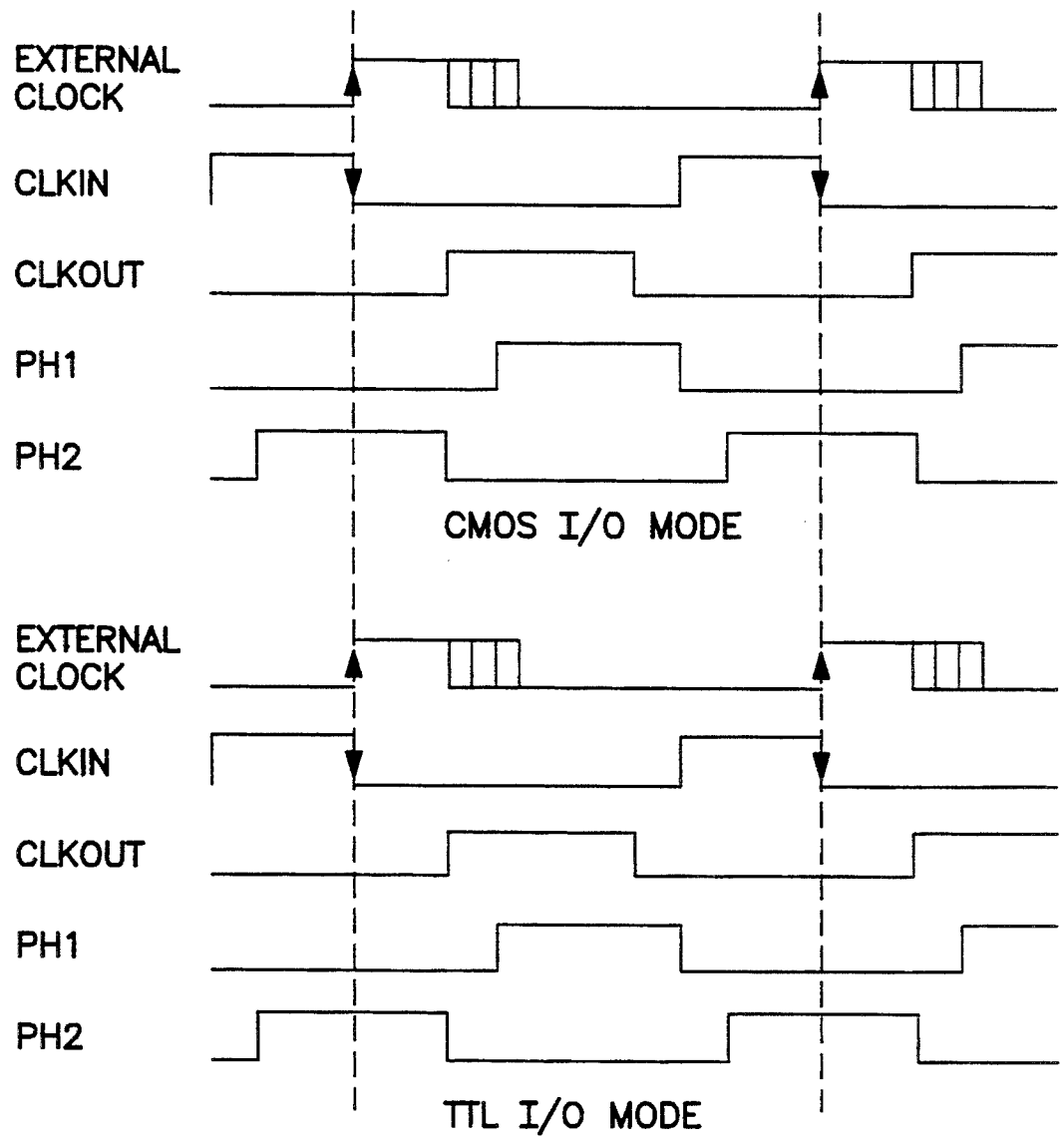
FIG. 5 is a diagram showing the clock waveforms of certain clock signals generated by operation of the present invention.

The delay line can be programmed such that two stages can be added or subtracted from the line. The signal CMOS/TTL determines the configuration of the line. When this signal is active (i.e. in the CMOS I/O mode), each delay line is only 6 stages long. When this signal is deactivated (i.e. in the TTL I/O mode), each delay line becomes 8 stages long. The TTL I/O mode therefore has a longer delay from the falling edge of PA to the falling edge of PH2 and the rising edges of CLKOUT and PH1. The signal relationships are shown in FIG. 5. The net result of invoking the TTL I/O mode is to shift the entire input and output window of the microprocessor later with respect to the external clock. This is consistent with the additional delay in the input path imposed by the TTL input buffer circuitry, where TTL-to-CMOS level translation has to be performed.

Figure 6:
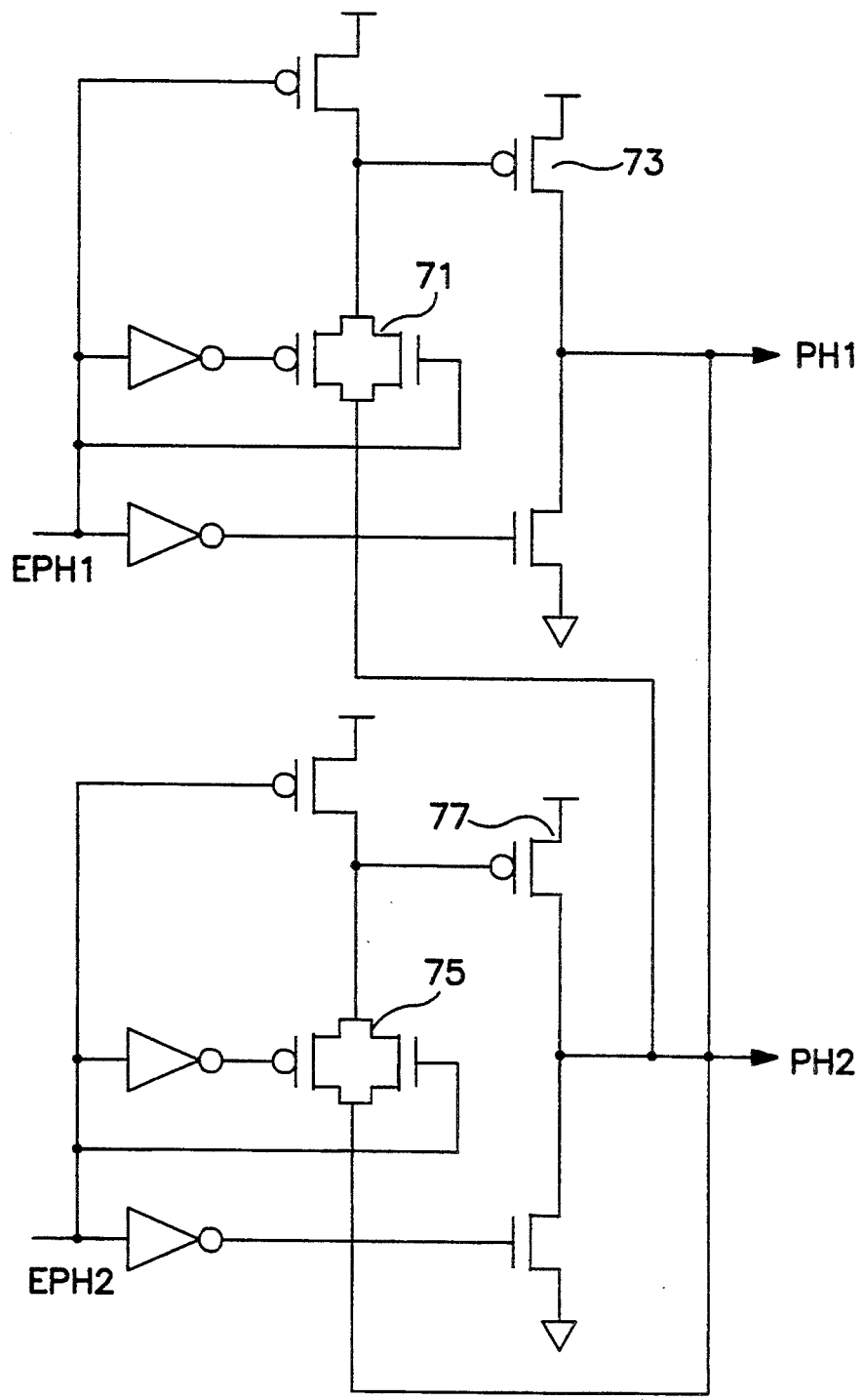
FIG. 6 is a block diagram of non-overlap clock driver 69.

The non-overlap global clock driver is shown in FIG. 6. This driver provides sufficient amplification to the signal from the delay line to control the microprocessor core. Only the rising edge of the input signals EPH1 and EPH2 are relevant as timing edges. When EPH2 goes low, PH1 is discharged. Meanwhile, even if EPH1 has gone high, the charging of PH2 does not commence until the transmission gate 71 tied to PH2 is turned on, and the discharge of PH2 also brings about the discharge of the gate 73 of the pullup of PH1. This ensures non-overlap between PH2 and PH1, and vice versa by operation of transmission gate 75 and the discharge of the gate 77 of the pullup of PH2. This is the preferred embodiment because the nodes PH1 and PH2 are heavily loaded and are therefore slow. PH1 must wait for the PH2 to discharge before it can start charging, and vice versa. Thus, if the non-overlap time between the inputs EPH1 and EPH2 is small or zero, then the non-overlap of PH1 and PH2 is mainly determined by this circuit.

This description assumes that a two phase clock signal is needed by the microprocessor. If only a single phase clock is required, then non-overlap generator 23, the second path in delay line 27 and non-overlap global clock driver 69 would not generate the second clocking signal. Thus the output of divide by 2 circuit 21 may be input directly to a single path delay line 27 whose output is then provided to a clock driver which generates the microprocessor core clock.

We claim:

1. A circuit for eliminating skew between two clock signals used in a microprocessor comprising:
   a) phase detector means for detecting phase differences between an internal clock signal and an external clock signal and generating UP and DN signals representing the detected phase differences;
   b) charge pump means coupled to the phase detector means for generating a control signal based upon said UP and DN signals;
   c) voltage controlled oscillator means coupled to said charge pump means for generating a timing signal based upon said control signal;
   d) delay line means for tracking circuit delays in said microprocessor, said delay line means including a plurality of delay elements for delaying said timing signal, wherein a first signal tapped from said plurality of delay elements is said internal clock signal which is one of said inputs to said phase detector means and wherein a second signal is tapped from said plurality of delay elements at a position different from the location at which said first signal is tapped:
   e) a multiplexor coupled to said delay line means having said first tapped signal and said second tapped signal as inputs, said multiplexor adapted to select one of said first and said second signals as said internal clock signal; whereby said selected signal is used as a clocking signal for I/O timings for a predetermined one of a TTL circuit and a CMOS circuit.

2. The circuit defined by claim 1 further comprising means coupled between said voltage controlled oscillator means and said delay line means for providing a predetermined duty cycle to said timing signal.

3. The circuit defined by claim 1 further comprising global clock driver means coupled to said delay line for generating a clock signal for controlling said microprocessor.

4. The circuit defined by claim 1 wherein each of said plurality of delay elements comprises a first inverter whose output is coupled to a set of three inverters coupled in parallel, and the output of the middle one of said set of three parallel inverters is coupled to a transmission gate whose output is coupled to an adjacent delay element.

5. A circuit for eliminating skew between two clock signals used in a microprocessor comprising:
   a) phase detector means for detecting phase differences between an internal clock signal and an external clock signal and generating UP and DN signals representing the detected phase differences;
   b) charge pump means coupled to the phase detector means for generating a control signal based upon said UP and DN signals;
   c) voltage controlled oscillator means coupled to said charge pump means for generating a timing signal based upon said control signal;
   d) non-overlap generator means coupled to said voltage controlled oscillator means for generating a pair of complementary outputs from said timing signal such that one of said complementary signals can be pulled up only after the other of said complementary signals has gone low;
   e) delay line means for tracking circuit delays in said microprocessor, said delay line means including a first and second plurality of delay elements, said first plurality of delay elements for delaying one of said pair of complementary outputs and said second plurality of delay elements for delaying the other one of said pair of complementary outputs, wherein a first signal tapped from said first plurality of delay elements is said internal clock signal which is one of said inputs to said phase detector means.

6. The circuit defined by claim 5 further comprising means coupled between said voltage controlled oscillator means and said non-overlap generator means for providing a predetermined duty cycle to said timing signal.

7. The circuit defined by claim 5 further comprising non-overlap global clock driver means coupled to said delay line for generating PH1 and PH2 clock signals which are non-overlapping for controlling said microprocessor.

8. The circuit defined by claim 5 wherein a second signal is tapped from said plurality of delay elements at a position different from the location at which said first signal is tapped, and said circuit further comprises means for selecting one of said first and said second signals as said internal clock signal, whereby said selected signal is used as a clocking signal for I/O timings for a predetermined one of a TTL circuit and a CMOS circuit.

9. The circuit defined by claim 5 wherein each of said first and second plurality of delay elements comprises a first inverter whose output is coupled to a set of three inverters coupled in parallel, and the output of the middle one of said set of three parallel inverters is coupled to a transmission gate whose output is coupled to an adjacent delay element.

* * * * *